(12) United States Patent
Yoo et al.

(10) Patent No.: US 7,009,868 B2
(45) Date of Patent: Mar. 7, 2006

(54) MEMORY DEVICE HAVING A TRANSISTOR AND ONE RESISTANT ELEMENT AS A STORING MEANS AND METHOD FOR DRIVING THE MEMORY DEVICE

(75) Inventors: In-kyeong Yoo, Suwon (KR); Sun-ae Seo, Seoul (KR); Hyun-jo Kim, Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/995,116

(22) Filed: Nov. 24, 2004

(65) Prior Publication Data

US 2005/0095775 A1    May 5, 2005

Related U.S. Application Data

(62) Division of application No. 10/602,736, filed on Jun. 25, 2003, now Pat. No. 6,838,727.

(30) Foreign Application Priority Data

Jul. 10, 2002  (KR) ............................... 2002-39988

(51) Int. Cl.
G11C 11/00  (2006.01)

(52) U.S. Cl. ................. 365/148; 365/163; 365/174; 365/182

(58) Field of Classification Search ............... 365/148, 365/163, 174, 182

See application file for complete search history.

(56) References Cited

U.S. PATENT DOCUMENTS 6,773,929 B1   8/2004 Oh et al.

*Primary Examiner*—Thien F. Tran
(74) *Attorney, Agent, or Firm*—Lee & Morse, P.C.

(57) ABSTRACT

A memory device having one transistor and one resistant element as a storing means and a method for driving the memory device, includes an NPN-type transistor formed on a semiconductor substrate, an interlayer insulating film formed on the semiconductor substrate to cover the transistor in which a contact hole exposing a source region of the transistor is formed, a resistant material in which a bit data "0" or "1" is written connected to the source region of the transistor by a conductive plug or an insulating film, and a conductive plate contacting the resistant material. The memory device exhibits improved degree of integration, reduced current consumption by lengthening a refresh period thereof, and enjoys simplified manufacturing process due to a simple memory cell structure.

16 Claims, 7 Drawing Sheets

MEMORY DEVICE HAVING A TRANSISTOR AND ONE RESISTANT ELEMENT AS A STORING MEANS AND METHOD FOR DRIVING THE MEMORY DEVICE

This application is a DIVISION of application Ser. No. 10/602,736, filed Jun. 25, 2003 now U.S. Pat. No. 6,838,727.

BACKGROUND OF THE INVENTION

1. Field of the Invention

The present invention relates to a memory device and a method for driving the same. More particularly, the present invention relates to a memory device having a cell that has one transistor and one resistant element, in which the resistant element acts as a storing means, and a method for driving the memory device.

2. Description of the Related Art

In general, a memory device, particularly a unit memory cell in which data is written in a DRAM (dynamic random access memory), is constructed with one transistor and one capacitor. The capacitor represents a region in which data is written, namely, a data storage region. In order to prevent any data loss or data error when writing and reading data, the capacitor is required to have a certain electrostatic capacity.

As memory devices become more highly integrated, a region occupied by a capacitor in a memory cell becomes smaller. However, the electrostatic capacity of the capacitor required for storing data remains the same.

To increase the electrostatic capacity of a capacitor in a limited region, the region of the capacitor in which electrodes are positioned must be as large as possible, the distance between the electrodes as small as possible, and the dielectric material between the electrodes as conductive as possible.

By processing electrodes to have three-dimensional shapes such as cylindrical shapes, the region of the capacitor in which the electrodes are positioned may be enlarged. However, unlike manufacturing capacitors having two-dimensionally shaped electrodes, manufacturing a capacitor having such three-dimensionally shaped electrodes is difficult due to the structural complexity of the capacitor. By decreasing the thickness of the dielectric material, the distance between the electrodes may be decreased. However, a thin dielectric layer leads to increased leakage current. Using a dielectric material that is highly conductive greatly increases the electrostatic capacity of the capacitor compared to using a thin dielectric film. However, when manufacturing semiconductor devices using highly conductive materials as capacitor dielectrics, etching becomes more complicated and the product price increases because the materials used for the electrode are limited to precious metals having high etching resistance.

Due to the existing problems, the manufacturing process of a memory device using a capacitor as a storing means becomes more complex. As a result, manufacturing reproducibility and memory device reliability may be poor, leading to a sharp decrease in yield.

SUMMARY OF THE INVENTION

It is therefore a feature of an embodiment of the present invention to provide a memory device having an enhanced degree of integration due to a simple memory cell structure of the memory device, simplifying a manufacturing process of the memory device and lengthening a refresh period of the memory device to reduce current consumption.

It is another feature of an embodiment of the present invention to provide a method for driving the memory device.

In one embodiment, the present invention provides a memory device including a semiconductor substrate, an NPN-type transistor formed on the semiconductor substrate, an interlayer insulating film formed on the semiconductor substrate to cover the transistor, in which a contact hole exposing a source region of the transistor is formed, a conductive plug filling the contact hole, a resistant material in which a bit data "0" or "1" is to be written formed on the conductive plug, a conductive plate formed on the interlayer insulating film to be contacted with the resistant material. The resistant material is preferably contacted with the source region of the transistor through the conductive plug.

Additional features and advantages of the invention will be set forth in the description which follows and, in part, will be obvious from the description, or may be learned by practice of the invention.

A first material film through which electrons can tunnel may be positioned between the conductive plug and the resistant material. A second material film through which electrons can tunnel may be positioned between the resistant material and the conductive plate. Either of the first and second material films may be an n-type poly silicon film, a p-type silicon film, a silicon oxide film or an aluminum oxide film.

The resistant material is preferably an amorphous dielectric film capable of trapping electrons during a predetermined time required for storing data according to predetermined values or directions of a voltage or current. The amorphous dielectric film is preferably a silicon nitride film ($Si_3N_4$) or an aluminum oxide film ($Al_2O_3$).

When the resistant material is the silicon nitride film, the conductive plug is preferably the same material layer as the material layer of the source region and the conductive plate is preferably an aluminum (Al) plate.

When the resistant material is the aluminum oxide film, the conductive plug is preferably a gold (Au) plug or a platinum (Pt) plug, and the conductive plate is preferably an aluminum (Al) plate.

A material layer including the conductive plug, the resistant material and the conductive plate preferably has a thickness that allows charges used for writing the bit data to tunnel through the material layer. A material layer including the conductive plug, the first material film, the resistant material and the conductive plate preferably has a thickness that allows charges used for writing the bit data to tunnel through the material layer. A material layer including the conductive plug, the first material film, the resistant material, the second material film and the conductive plate preferably has a thickness that allows charges used for writing the bit data to tunnel through the material layer.

In another feature of an embodiment of the present invention, a memory device is provided including a semiconductor substrate, an NPN-type transistor formed on the semiconductor substrate, an interlayer insulating film formed on the semiconductor substrate to cover the transistor, in which a contact hole exposing a source region of the transistor is formed, an insulating film formed on the entire surface of the source region exposed through the contact hole, a resistant material in which a bit data "0" or "1" is written formed on the interlayer insulating film to be contacted with the entire surface of the insulating film, and a conductive plate covering the entire surface of the resistant material.

A material film, through which electrons can tunnel, may be further positioned between the resistant material and the conductive plate. Here, the material film is preferably an n-type poly silicon film, a p-type silicon film, a silicon oxide film or an aluminum oxide film. The resistant material is preferably an amorphous dielectric film capable of trapping electrons during a predetermined time required for storing data according to predetermined values or directions of a voltage or current. The amorphous dielectric film is preferably a silicon nitride film ($Si_3N_4$) or an aluminum oxide film ($Al_2O_3$). The conductive plate is preferably an aluminum (Al) plate.

It is another feature of an embodiment of the present invention to provide a method for writing bit data of a memory device that includes a semiconductor substrate, an NPN-type transistor formed on the semiconductor substrate, an interlayer insulating film formed on the semiconductor substrate to cover the transistor, in which a contact hole exposing a source region of the transistor is formed, a conductive plug filling the contact hole, a resistant material in which a bit data "0" or "1" is written formed on the conductive plug, and a conductive plate formed on the interlayer insulating film to be contacted with the resistant material, the method including initializing the resistant material and charging the resistant material to write the bit data "0" or "1" therein.

Preferably, the conductivity of the resistant material is enhanced by a forming process. A forming voltage is preferably applied to a drain of the transistor.

Preferably, the transistor is on, a bit line voltage (Vb) is applied to a drain region of the transistor and a plate voltage (Vb/2) is applied to the conductive plate, to write the bit data "0" or "1" in the resistant material.

After the bit data "0" or "1" is written, the transistor is turned off to lengthen a time the bit data is retained.

It is another feature of an embodiment of the present invention to provide a method for writing bit data of a memory device including initializing the resistant material and enhancing the resistance of the resistant material and writing the bit data "0" or "1" therein.

The resistance of the resistant material may be enhanced by discharging the resistant material, turning the transistor on and applying a plate voltage (Vb/2) to the conductive plate, or turning the transistor on and applying a switching voltage (Vs) to the conductive plate.

Preferably, the resistant material, as an amorphous dielectric film, is a silicon nitride film or an aluminum oxide film. When the resistant material is the silicon nitride film, the transistor is turned on, an opposite voltage to a bit line voltage (Vb) is applied to a drain region of the transistor and a plate voltage (Vb/2) is applied to the conductive plate, to enhance the resistance of the resistant material. When the resistant material is the aluminum oxide film, the transistor is turned on, a different voltage from a bit line voltage (Vb) is applied to a drain region of the transistor and a plate voltage (Vb/2) is applied to the conductive plate, to enhance the resistance of the resistant material.

It is yet another feature of an embodiment of the present invention to provide a method for reading a written bit data in a memory device measuring a current flowing from the resistant material and reading the written bit data in the resistant material. After a sense amplifier is connected to the drain region of the transistor, the transistor is turned on and a plate voltage (Vb/2) is applied to the conductive plate to measure the current flowing through the resistant material.

Another feature of the present invention provides a method for reading a written bit data in a memory device that includes a semiconductor substrate; an NPN-type transistor formed on the semiconductor substrate; an interlayer insulating film formed on the semiconductor substrate to cover the transistor, in which a contact hole exposing a source region of the transistor is formed; a conductive plug filling the contact hole; a resistant material in which a bit data "0" or "1" is written formed on the conductive plug; and a conductive plate formed on the interlayer insulating film to be contacted with the resistant material, wherein the bit data which is written in the resistant material is read by measuring a current flowing through the resistant material and reading the written bit data in the resistant material. Preferably, after a sense amplifier is connected to a drain region of the transistor, the transistor is turned on and a reading voltage (Vr) is applied to the conductive plate to measure the current flowing through the resistant material.

Accordingly, it is possible to enhance a degree of integration of a memory device by simplifying a memory cell structure and a manufacturing process thereof. It is also possible to reduce current consumption of the memory device by lengthening a refresh period of the memory device.

BRIEF DESCRIPTION OF THE DRAWINGS

The above features and advantages of the present invention will become more apparent to those of ordinary skill in the art by describing in detail preferred embodiments thereof with reference to the attached drawings in which.

DETAILED DESCRIPTION OF THE INVENTION

Figure 1:
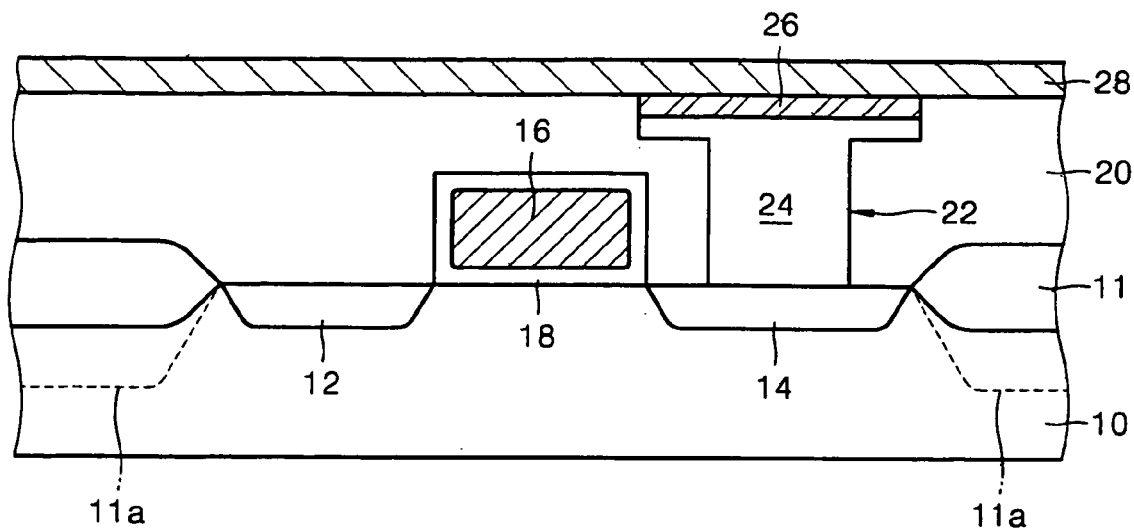
FIG. 1 illustrates a sectional view of a memory device according to a first embodiment of the present invention.

Korean Patent Application No. 2002-39988, filed on Jul. 7, 2002, and entitled: "Memory Device Having a Transistor and One Resistant Element as a Storing Means and Method For Driving the Device" is incorporated by reference herein in its entirety.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like numbers refer to like elements throughout.

Referring to FIGS. 1 through 5, a memory device according to embodiments of the present invention will be presented.

First Embodiment

A memory device according to the first embodiment of the present invention has a transistor on a semiconductor substrate and a resistor instead of a conventional capacitor, as a means for storing bit data such as "0" or "1".

Specifically, referring to FIG. 1, in a semiconductor substrate 10 are defined a region in which the memory device is formed (hereinafter referred to as "active region") and an region in which a field oxide film (or a device separator) is formed for separating the memory device (hereinafter referred to as "field region"). Preferably, the semiconductor substrate 10 is doped with a p-type conductive impurity. The semiconductor substrate 10 may be an n-type semiconductor substrate having a p-well, in which the p-type conductive impurity is doped in a region where the memory device is formed. A field oxide film 11 is formed on the field region of the semiconductor substrate 10. The field oxide film 11 is a Locos-type field oxide. The field oxide film 11 may be substituted by a trench-type oxide film 11A as indicated by the dotted line. A gate electrode 16 is formed on a predetermined region of the active region of the semiconductor substrate 10. A gate insulating film 18 exists between the gate electrode 16 and the semiconductor substrate 10. There also exist first and second impurity regions 12 and 14 which are doped with an n-type conductive impurity to a shallow depth between the gate electrode 16 and the field oxide film 11. The first impurity region 12 at the left side of the gate electrode 16 is the drain region of the transistor and the second impurity region 14 at a right side of the gate electrode 16 is the source region of the transistor. The first and second regions 12 and 14 and the gate electrode 16 constitute an NPN-type transistor of the memory device. On the semiconductor substrate 10, an interlayer insulating film 20 is formed to cover the transistor. A first contact hole 22 exposing the second region 14 is formed in the interlayer insulating film 20. An upper portion of the first contact hole 22 is larger than a lower portion of the first contact hole 22 in width. The lower portion and a lower part of the upper portion of the first contact hole 22 are filled with a conductive plug 24. The rest of the upper portion of the first contact hole 22, namely an uppermost layer having a predetermined thickness, is filled with a first storing means 26 for storing bit data such as "0" or "1". The first storing means 26 is a resistant material. The resistant material is a material film such as an amorphous dielectric film capable of trapping a charge during a predetermined time required for storing data according to a value or a direction of a voltage or current applied from the outside. Preferably, the amorphous dielectric film is a silicon nitride film ($Si_3N_4$). The amorphous dielectric film may be an aluminum oxide film ($Al_2O_3$).

It is desirable to change the material of the conductive plug 24 according to the material used as the first storing means 26. For example, it is desirable that the material of the conductive plug 24 is the same as the second conductive impurity region 14, i.e., the source region of the transistor, when the first storing means 26 is the silicon nitride film as described above. Therefore, in this case, it is desirable that the conductive plug 24 is an n-doped poly silicon plug. Further, preferably, the material of the conductive plug 24 is a precious metal, e.g., gold (Au), when the first storing means 26 is an aluminum oxide film.

After that, a first conductive plate 28 is formed on the interlayer insulating film 20 contacting the entire surface of the first storing means 26. The first conductive plate 28 is formed as a line or a pad. Preferably, the material of the first conductive plate 28 is aluminum.

Preferably, the entire thickness of a material layer including the conductive plug 24, the first storing means 26 and the first conductive plate 28 is about 15 nm.

Figure 2:
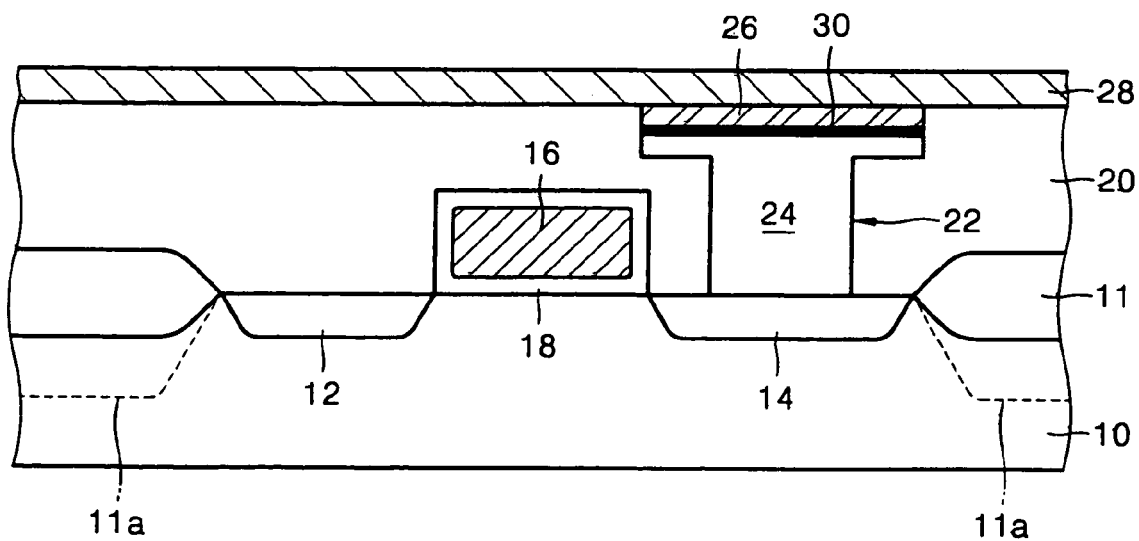
FIGS. 2 through 4 illustrate sectional views of transformation examples of the memory device of FIG. 1.
Figure 4:
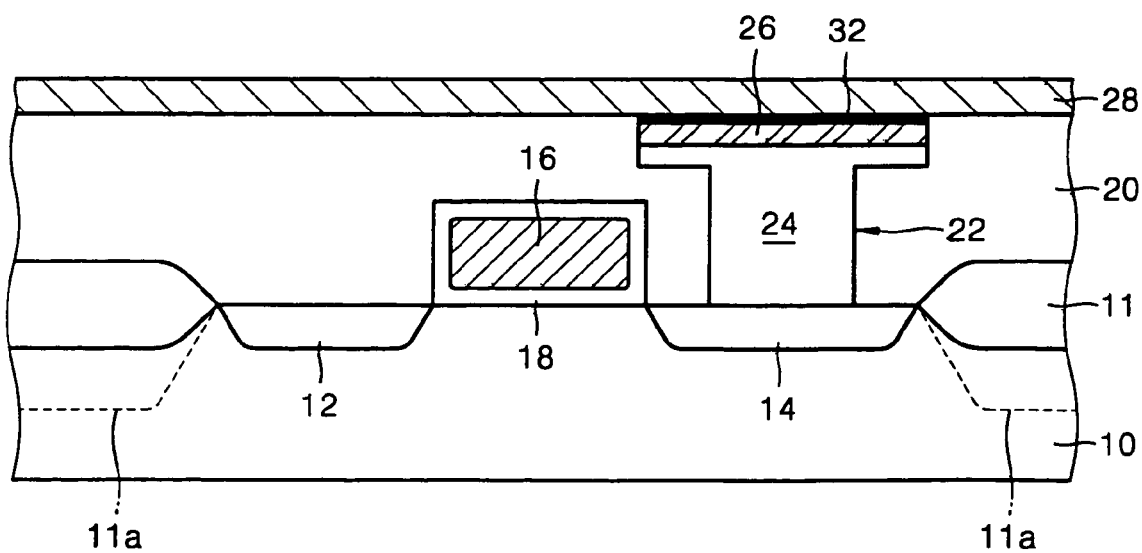

A member for improving a data storing function of the first storing means 26 may be included between the first storing means 26 and the conductive plug 24. The member may be additionally or alternatively included between the first storing means 26 and the first conductive plate 28. FIGS. 2 and 4 show examples of the foregoing, and are described in greater detail presently.

Referring to FIG. 2, a first material film 30 is used as the member and is included between the conductive plug 24 and the first storing means 26.

Figure 3:
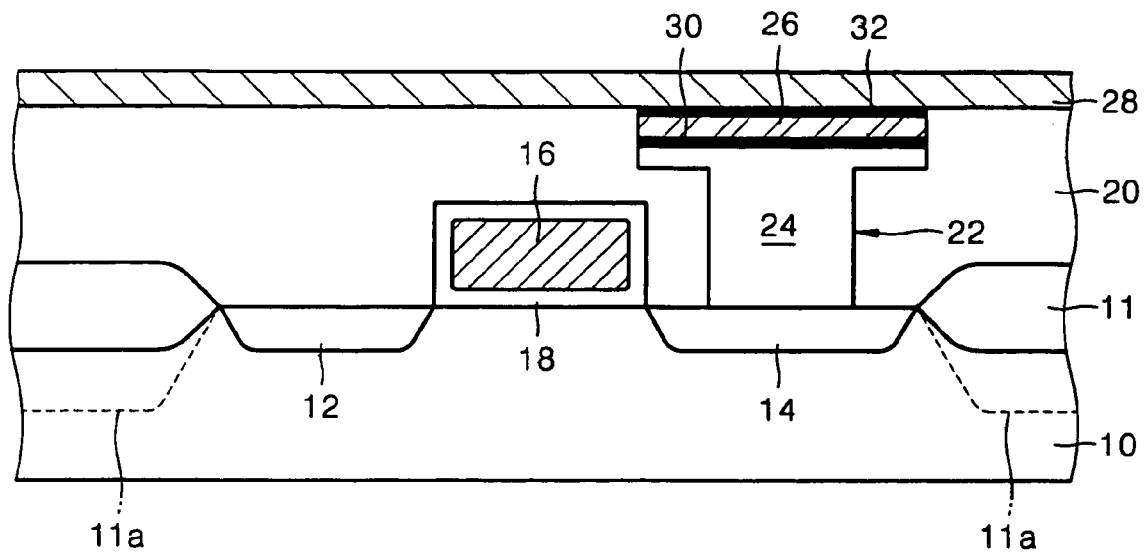

Referring to FIG. 3, the first material film 30 as the member is included between the conductive plug 24 and the first storing means 26. A second material film 32 as the member is included between the first storing means 26 and the first conductive plate 28.

FIG. 4 shows that the second material film 32 as the member is included only between the conductive first storing means 26 and the first conductive plate 28.

The first material film 30 and the second material film 32 may be formed of an n-type poly silicon film, a p-type poly silicon film or an insulating film. Here, the insulating film is a silicon oxide film or an aluminum oxide film.

Preferably, the thickness between the second impurity region 14 and the first conductive plate 28 in a memory device according to the first embodiment of the present invention is a thickness through which a charge such as an electron, which is trapped in the first storing means 26, can tunnel.

Second Embodiment

A second embodiment of the present invention provides a memory device excluding the conductive plug, which connects the transistor and the storing means.

Figure 5:
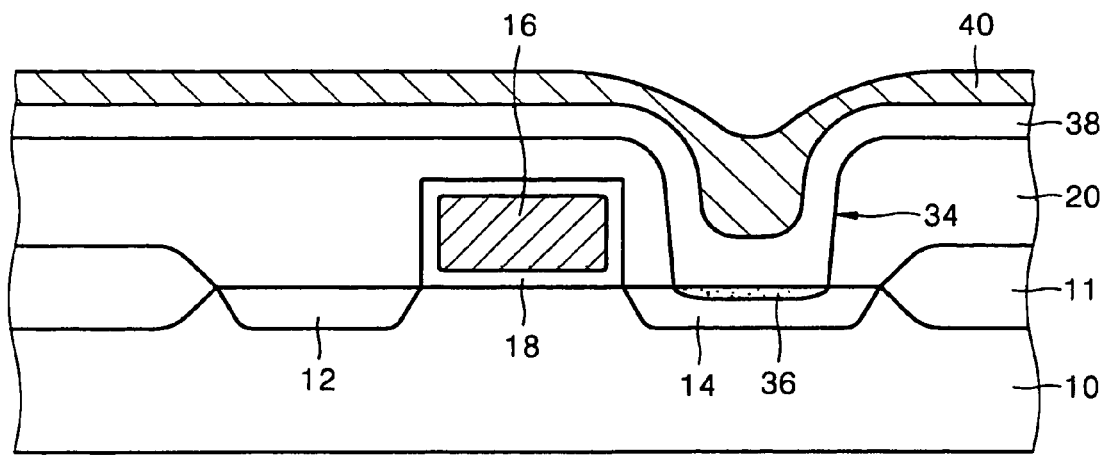
FIG. 5 illustrates a sectional view of a memory device according to a second embodiment of the present invention.

Specifically, referring to FIG. 5, a transistor is formed on the semiconductor substrate 10, as in the memory device according to the first embodiment, and an interlayer insulating film 20 is formed to cover the transistor. A second contact hole 34, in which a second impurity region 14 is exposed, is formed on the interlayer insulating film 20. An insulating film 36 is formed on an exposed region of the second impurity region 14 through the second contact hole 34. Preferably, the insulating film 36 is a silicon oxide film formed by a natural oxidation of the region of the second impurity region 14 that is exposed through the second contact hole 34. However, another insulating film may be used instead of the silicon oxidation film provided the charge can tunnel directly through the insulating film. A second storing means 38, which functions similarly to the first storing means 26 of the first embodiment illustrated in FIGS.

1–4, is formed on the interlayer insulating film 20. The second storing means 38 is formed inside the second contact hole 34 to be on the inner sidewalls and bottom of the second contact hole 34 and to contact the entire surface of the insulating film 36. Similar to the first storing means 26 of the first embodiment, it is desirable that the second storing means 38 is a resistant material for storing bit data such as "0" or "1". The resistant material is the same as that of the first embodiment, and therefore, the corresponding description will be omitted. A second conductive plate 40 is formed on the second storing means 38. The material of the second conductive plate 40 may be aluminum, as in the case of the first storing means 26 of the first embodiment.

Next, a method for driving memory devices according to embodiments of the present invention will be described. For convenience, a method for driving the memory device according to the first embodiment of the present invention will be described. However, the method may also be applied to the memory device according to the second embodiment of the present invention.

Writing Bit Data

Referring to FIG. 1, the storing means 26 is initialized to be suitable for storing bit data, before the bit data "0" or "1" is written in the first storing means 26. This process is called "forming." During the forming process, charges of the first storing means 26, e.g., electrons, are trapped therein. In the forming process, the transistor remains ON and a forming voltage is applied to the first impurity region 12 through a bit line (not shown). After "forming" the first storing means 26, the conductivity of the first storing means 26 becomes high due to the electrons trapped in the resistant material thereof. The electrons trapped in the first storing means 26 by the forming process dissipate naturally over time.

Figure 6:
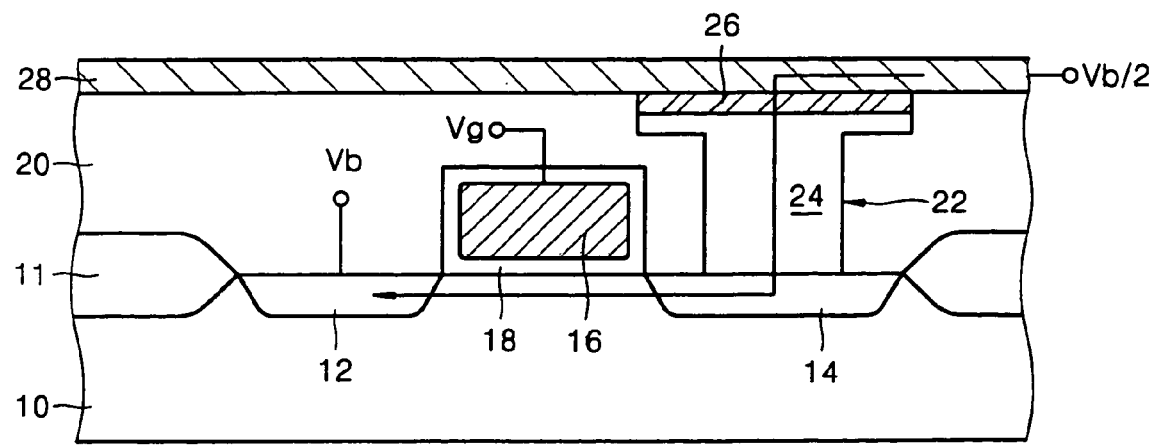
FIG. 6 illustrates a sectional view for explaining a method for writing bit data "0" by using the memory device of FIG. 1.

Therefore, as shown in FIG. 6, a gate voltage (Vg) is applied to the gate electrode 16 to keep the transistor ON. At this time, a bit line voltage (Vb) is applied to the first impurity region 12 through the bit line (not shown). After that, a plate voltage (Vb/2) is applied to the first conductive plate 28 to again trap electrons in the first storing means 26. Many electrons are trapped in the first storing means 26 after the forming process by charging the first storing means 26, as described above. The foregoing state is regarded as a state in which the bit data "0" is written to the first storing means 26. When the bit data "0" is written, the first storing means 26 becomes highly conductive due to the electrons trapped therein. Therefore, the resistance of the first storing means 26 is reduced.

In the meantime, the electrons trapped in the first storing means 26 after the forming process are released naturally from the first storing means 26 over time. Therefore, after enough time has passed since the forming, a majority of trapped electrons are naturally discharged from the first storing means 26. Accordingly, the resistance of the first storing means 26 increases. When the resistance of the first storing means becomes high, the state of the first storing means 26 is regarded as a state in which the bit data "1" is written. However, after the forming is completed, it may take more time than a usual bit data writing time for the trapped electrons to be naturally discharged from the first storing means 26. Therefore, in order to drive the memory device fast, it is desirable for the trapped electrons to be discharged from the first storing means 26 as quickly as possible.

Figure 7:
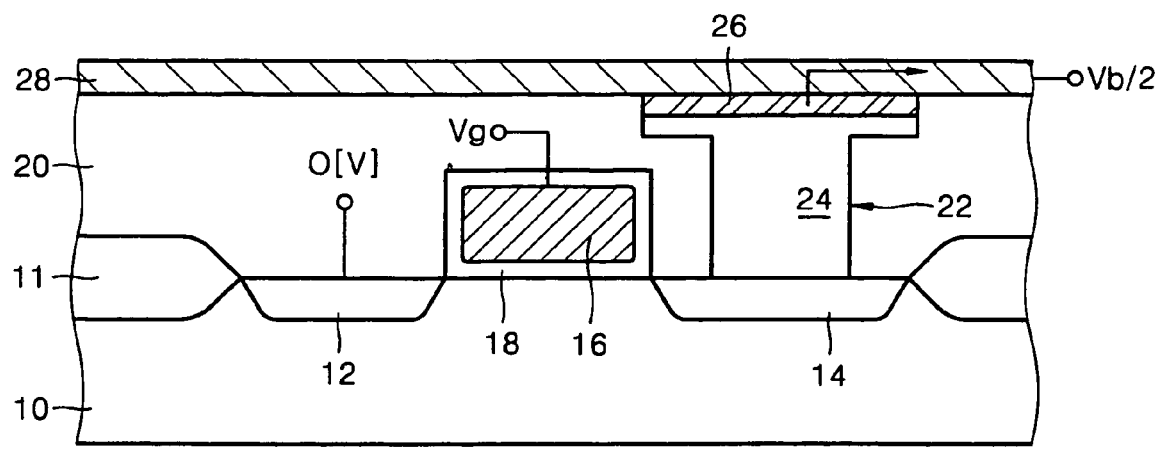
FIG. 7 illustrates a sectional view for explaining a method for writing bit data "1" by using the memory device of FIG. 1.

To this end, as shown in FIG. 7, the gate voltage (Vg) is applied to the gate electrode 16 to keep the transistor ON and the plate voltage (Vb/2) is applied to the first conductive plate 28. Then, a voltage of 0 volts 0[V] is applied to the first impurity region 12 through the bit line (not shown). As a result, the electrons trapped in the first storing means 26 are discharged rapidly, the conductivity of the first storing means 26 becomes low, and the resistance thereof becomes high, similar to the state of the first storing means 26 prior to the forming thereof. When the first storing means 26 is in a state of high resistance (low conductivity), the bit data "1" is written.

However, the bit data "1" may be written to the first storing means 26 by a switching method, instead of by discharging the trapped electrons.

Figure 11:
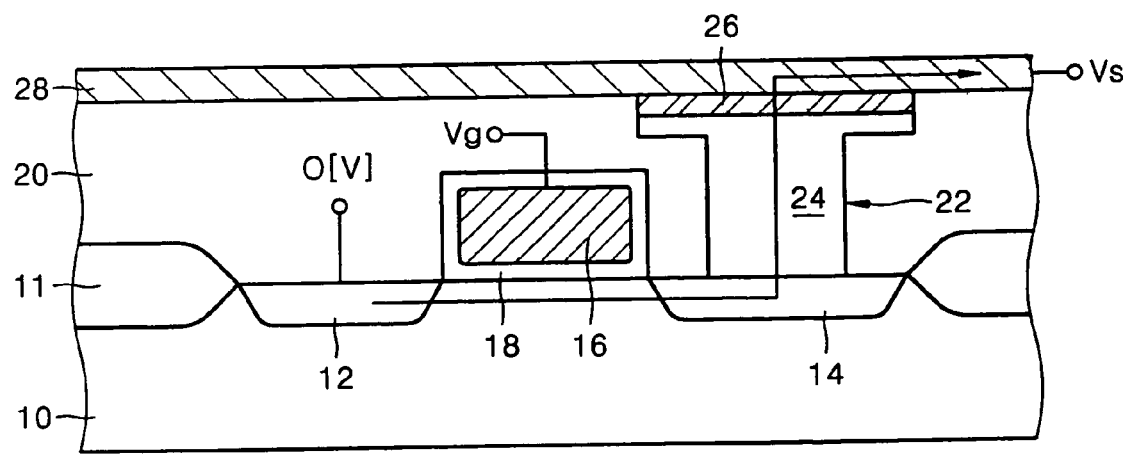
FIGS. 11 and 12 illustrate sectional views for explaining a process of writing bit data "1" in a resistant material by switching, in a memory device of FIG. 1.

Specifically, as shown in FIG. 11, the gate voltage (Vg) is applied to the gate electrode 16 to keep the transistor ON. In this state, a switching voltage (Vs) is applied to the first conductive plate 28. As a result, a resistance of the first storing means 26 becomes high as the trapped electrons in the first storing means 26 are discharged. Accordingly, the first storing means 26 is in a state where the bit data "1" is written. This switching method of writing the bit data "1" is faster than the method of writing only by discharging trapped electrons.

Figure 12:
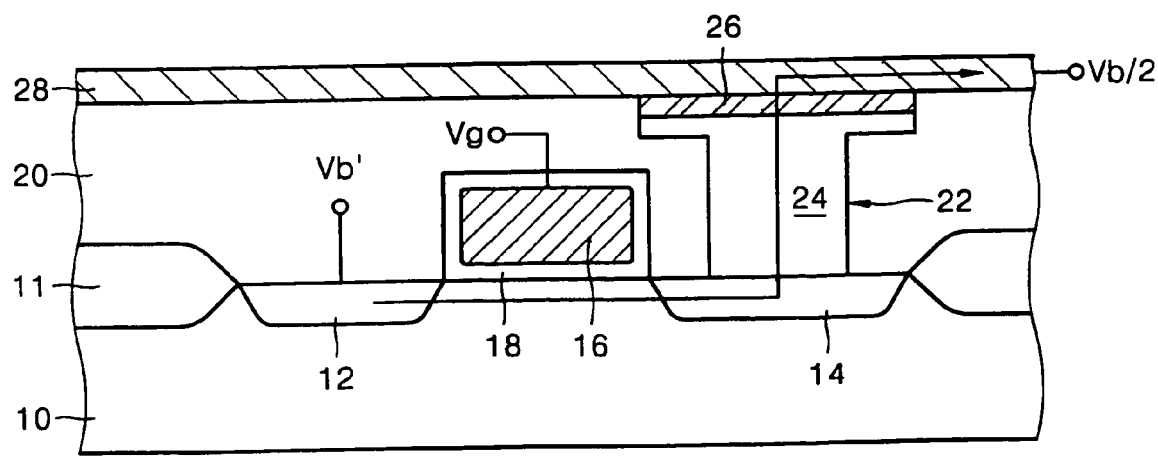

Another method for writing the bit data "1" is illustrated in FIG. 12. In the method illustrated in FIG. 12, a plate voltage (Vb/2) is applied to the first conductive plate 28, and a voltage (Vb') different from the bit line voltage (Vb) of FIG. 6 is applied to the first impurity region 12 through the bit line (not shown) to change a resistance value of the first storing means 26. In this method, the voltage (Vb') is varied according to the material of the first storing means 26. For example, when the first storing means 26 is a silicon nitride film ($Si_3N_4$), it is desirable that the absolute value of the voltage (Vb') is opposite to the bit line voltage (Vb) of FIG. 6. When the first storing means 26 is an aluminum oxide film ($Al_2O_3$), it is desirable that the absolute value of the voltage (Vb') is different from the absolute value of the bit line voltage (Vb) of FIG. 6.

Figure 8:
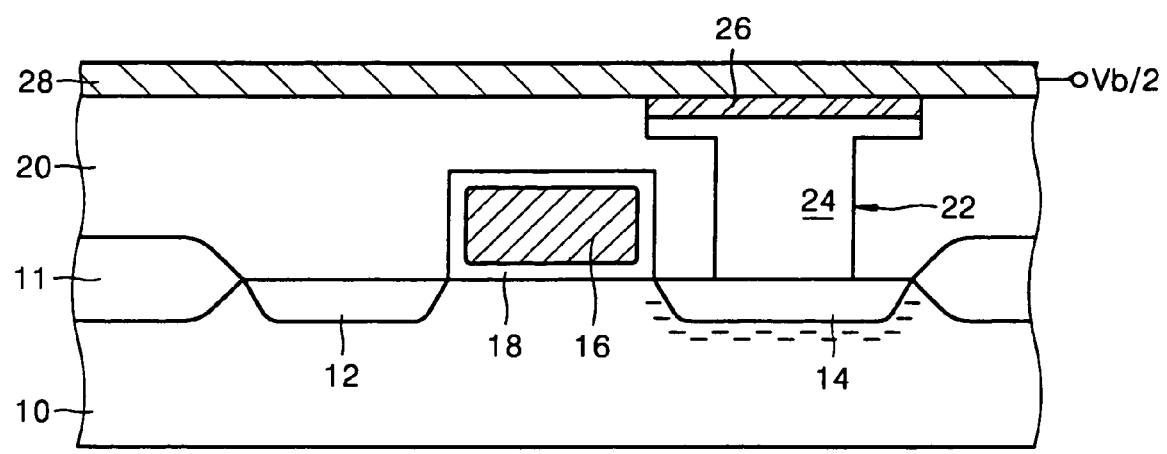
FIG. 8 illustrates a sectional view of showing charge retention of the memory device of FIG. 1.

In the meantime, in writing the bit data "0", when the gate voltage (Vg) is not applied to the gate electrode 16 after writing the bit data "0", as shown in FIG. 8, an open circuit is formed by the plate voltage (Vb/2) applied to the first conductive plate 28. As a result, the time the electrons trapped in the first storing means 26 are retained in the first storing means 26 becomes much longer. Therefore, a time necessary for writing the bit data "0" in the first storing means 26 and recharging the first storing means 26 to retain the data, i.e., a refresh period, becomes long.

In the description above, a state in which electrons are trapped in the first storing means 26 is regarded as a state in which the bit data "0" is written to the first storing means 26, and a state in which the resistance of the first storing means 26 is high due to discharging of the trapped electrons therefrom is regarded as a state in which the bit data "1" is written to the first storing means 26.

However, bit data writing may proceed in a way contrary to that described above. In other words, the state in which the electrons are trapped in the first storing means 26 may be regarded as a state in which the bit data "1" is written to the first storing means 26, and the state in which the resistance of the first storing means 26 is high due to discharging of trapped electrons therefrom may be regarded as a state in which the bit data "0" is written to the first storing means 26.

Bit Data Reading

Figure 9:
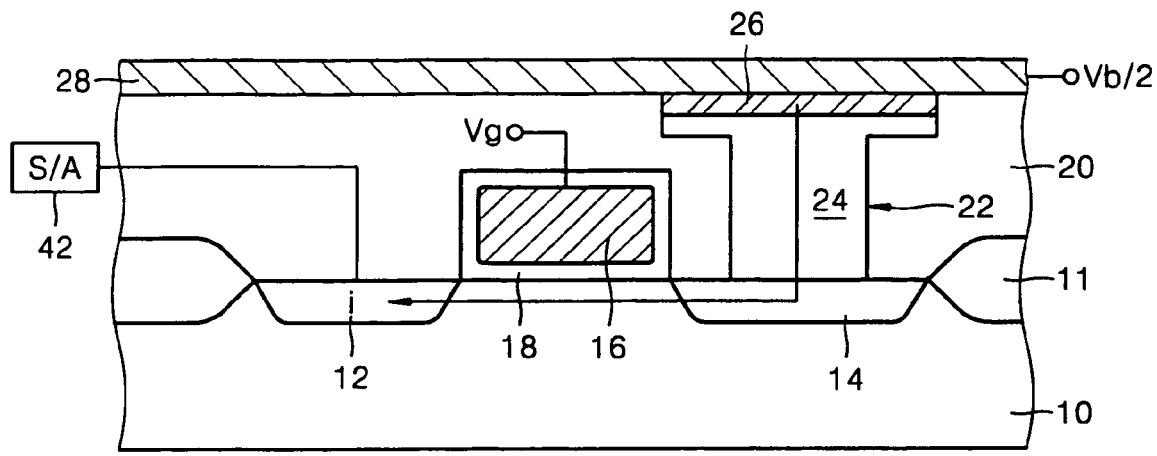
FIGS. 9 and 10 illustrate sectional views for explaining a method for reading bit data written in the memory device of FIG. 1.
Figure 10:
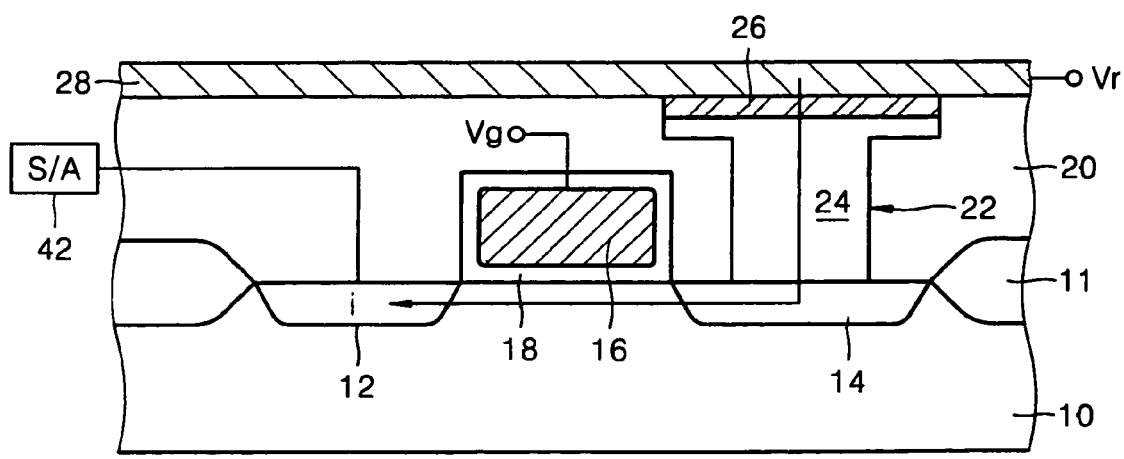

Referring to FIGS. 9 and 10, the bit data written in the first storing means 26 may be read by the following two methods.

In the first method, a current flowing through the first storing means 26 as the trapped electrons are discharged therefrom may be read by a sense amplifier 42 connected to the first impurity region 12 through the bit line (not shown).

In the second method, a current flowing through the resistant material of the first storing means 26 may be measured by the sense amplifier 42.

In either method, the current measured by the sense amplifier 42 when reading the bit data "0" is higher than the current measured when reading the bit data "1". By comparing the values the currents, it is possible to determine whether the bit data read from the first storing means 26 is "0" or "1".

FIG. 9 illustrates a sectional view of the memory device of FIG. 1 while reading a bit data written in the first storing means 26 by the first method described above. In the first method, the first impurity region 12 is connected to the sense amplifier 42 through the bit line (not shown) and the gate voltage (Vg) is applied to the gate electrode 16 to keep the transistor ON. At the same time, the plate voltage (Vb/2) is applied to the first conductive plate 28. When electrons are trapped in the first storing means 26, that is, when the bit data "0" is written, the trapped electrons begin to be discharged from the first storing means 26. Therefore, a current flows through the sense amplifier 42, and the sense amplifier 42 measures the current. When the bit data "1" is written in the first storing means 26, it is possible to know which bit data is written in the first storing means 26 by comparing the current values measured by the sense amplifier 42.

FIG. 10 illustrates a sectional view of the memory device of FIG. 7 while reading a bit data written in the first storing means 26 by the second method described above. In the second method, the first impurity region 12 is connected to the sense amplifier 42 through the bit line and the gate voltage (Vg) is applied to the gate electrode 16 to keep the transistor ON. At the same time, a reading voltage (Vr) is applied to the first conductive plate 28. Here, it is desirable that the reading voltage (Vr) is lower than a writing voltage, and that the reading voltage (Vr) does not allow too many electrons to be discharged from the first storing means 26. By such voltage application, when the bit data "0" is written in the first storing means 26, the conductivity of the first storing means 26 is high and a current i flows from the first conductive plate 28 to the first impurity region 12, a channel region (not shown) under the gate electrode 16, the second impurity region 14 of the conductive plug 24, and the first storing means 26. The value of the current i is measured by the sense amplifier 42.

In the meantime, when the bit data "1" is written in the first storing means 26, the conductivity of the first storing means 26 is very low, and the resistance of the first storing means 26 is very high. As a result, the value of the current i when reading the bit data "1" is much smaller than the value of the current i when reading the bit data "0". Therefore, by comparing the values of the currents, it is possible to determined whether the data bit written in the first storing means 26 is "0" or "1".

Figure 13:
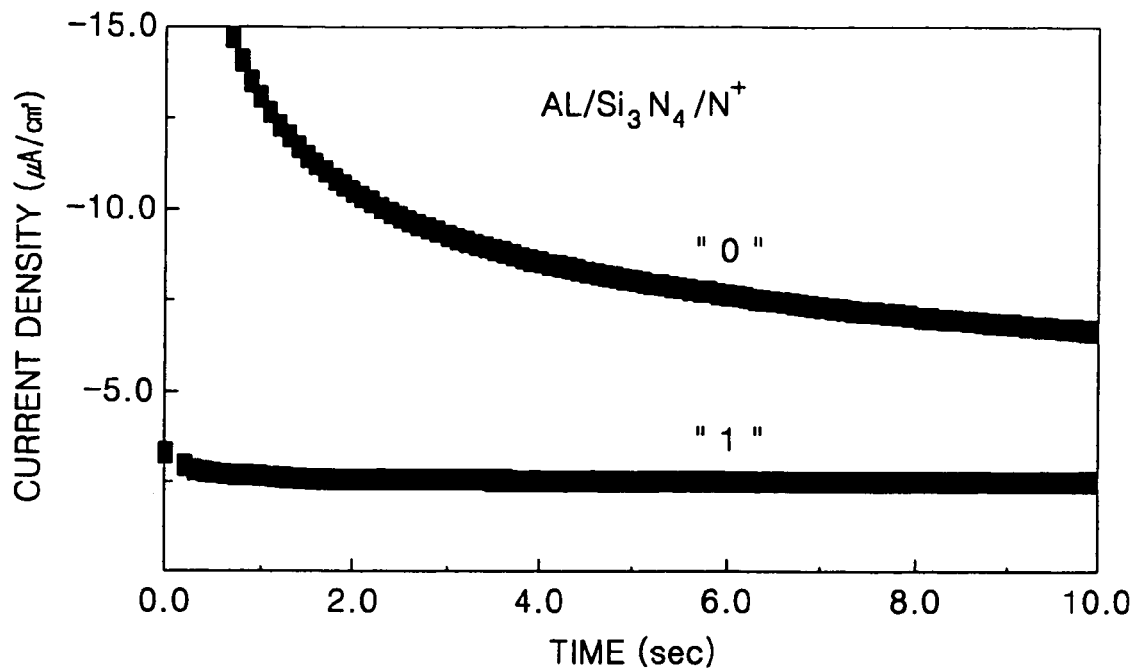
FIGS. 13 and 14 are graphs showing changes in current density versus time when bit data are read.
Figure 14:
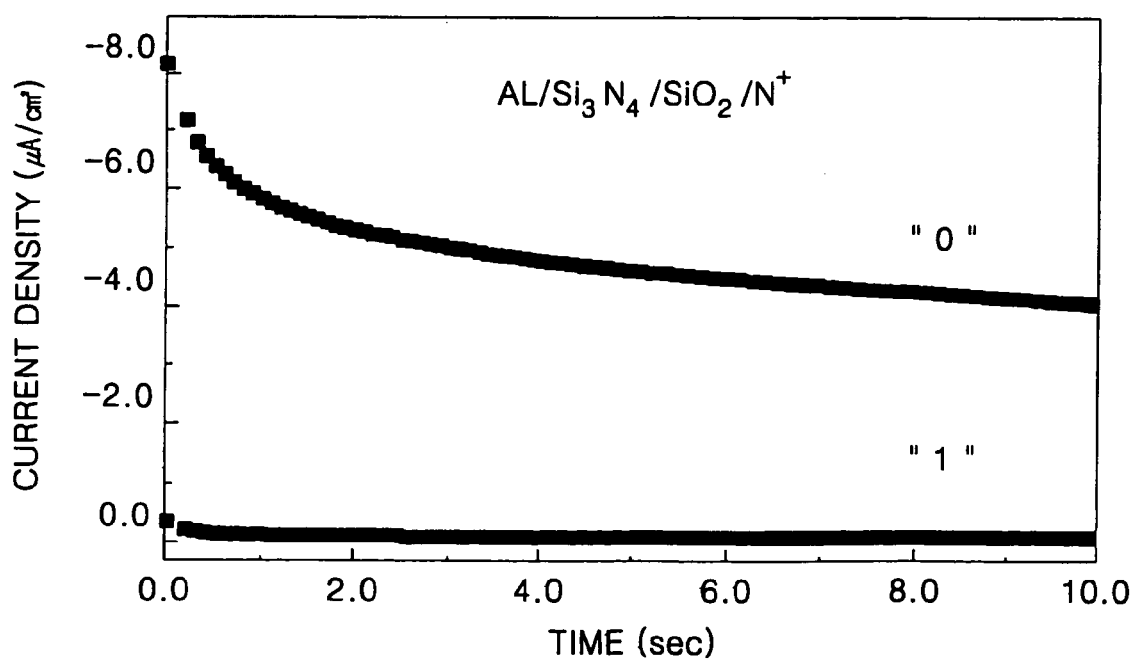

The reading voltage (Vr) and the value of the current measured using the sense amplifier 42 may respectively vary according to a lamination structure formed on the second impurity region 14 of the semiconductor substrate 10. FIGS. 13 and 14 show variations of current density versus time for different stack structures.

FIG. 13 shows a variation of current density versus time when the bit data "0" and the bit data "1" are read and when the conductive plug 24, the first storing means 26 formed of $Si_3N_4$ and first conductive plate 28 formed of Al are sequentially stacked. FIG. 14 shows a variation of current density versus time when a silicon oxide film is further included between the conductive plug 24 and the first storing means 26.

The result shown in FIG. 13 illustrates a case where the reading voltage (Vr) is −8V, and the result shown in FIG. 14 illustrates a case where the reading voltage (Vr) is −5V. When a silicon oxide film is further included between the conductive plug 24 and the first storing means 26, the reading voltage (Vr) is lower than when the silicon oxide film is not included.

The methods for reading bit data described above may be applied regardless of the method used to write the bit data.

As described above, in the memory device according to the present invention, a memory cell structure may be simplified and a volume of the memory cell may be reduced when compared with, a capacitor, which is a conventional storing means, by using a thin resistant material as the storing means. Therefore, the degree of integration of the memory device may be enhanced. Further, a structure of the resistant material used for the storing means is simple compared to that of a conventional capacitor. As a result, it is possible to simplify the manufacturing process. Additionally, electrons can be retained in the resistant material for a longer period of time, permitting a longer interval between refresh operations. Therefore, it is possible to reduce the current consumption of the memory device.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

For example, those skilled in the art may use other resistant materials instead of a silicon nitride film or an aluminum oxide film for the storing means. In addition, the insulating film included between the conductive plug and the storing means, and the insulating film included between the storing means and the conductive plug, may be substituted with a multi-layered insulating layer. Further, a third material film, which functions as the first material film or the second material film, may be further included between the second storing means and the second conductive plate. Therefore, the scope of the invention should be determined, without departing from the spirit and principles thereof, by the appended claims and their equivalents.

What is claimed is:

1. A method for writing bit data of a memory device that includes a semiconductor substrate; an NPN-type transistor formed on the semiconductor substrate; an interlayer insulating film formed on the semiconductor substrate to cover the transistor, in which a contact hole exposing a source region of the transistor is formed; a conductive plug filling the contact hole; a resistant material in which a bit data "0" or "1" is written formed on the conductive plug; and a conductive plate formed on the interlayer insulating film to be contacted with the resistant material, the method comprising:

initializing the resistant material; and
   charging the resistant material to write the bit data "0" or "1" therein.

2. The method as claimed in claim 1, wherein the conductivity of the resistant material is enhanced by a forming process.

3. The method as claimed in claim 2, wherein a forming voltage is applied to a drain region of the transistor.

4. The method as claimed in claim 1, wherein the transistor is on, a bit line voltage (Vb) is applied to a drain region of the transistor and a plate voltage (Vb/2) is applied to the conductive plate, to write the bit data "0" or "1" in the resistant material.

5. The method as claimed in claim 4, wherein after the bit data "0" or "1" is written, the transistor is turned off to lengthen a retaining time of the bit data.

6. A method for writing bit data of a memory device that includes a semiconductor substrate; an NPN-type transistor formed on the semiconductor substrate; an interlayer insulating film formed on the semiconductor substrate to cover the transistor, in which a contact hole exposing the source region of the transistor is formed; a conductive plug filling the contact hole; a resistant material in which a bit data "0" or "1" is written formed on the conductive plug; and a conductive plate formed on the interlayer insulating film to be contacted with the resistant material, the method comprising:

initializing the resistant material; and enhancing the resistance of the resistant material and writing the bit data "0" or "1" therein.

7. The method as claimed in claim 6, wherein the transistor is turned on and a switching voltage (Vs) is applied to the conductive plate, to enhance the resistance of the resistant material.

8. The method as claimed in claim 6, wherein a conductivity of the resistant material is enhanced by a forming process.

9. The method as claimed in claim 8, wherein a forming voltage is applied to a drain region of the transistor.

10. The method as claimed in claim 6, wherein the resistant material is discharged to enhance the resistance of the resistant material.

11. The method as claimed in claim 10, wherein the transistor is turned on and a plate voltage (Vb/2) is applied to the conductive plate, to enhance the resistance of the resistant material.

12. The method as claimed in claim 6, wherein the resistant material, as an amorphous dielectric film, is a silicon nitride film or an aluminum oxide film.

13. The method as claimed in claim 12, wherein when the resistant material is the silicon nitride film, the transistor is turned on, an opposite voltage to a bit line voltage (Vb) is applied to a drain region of the transistor and a plate voltage (Vb/2) is applied to the conductive plate, to enhance the resistance of the resistant material.

14. The method as claimed in claim 12, wherein when the resistant material is the aluminum oxide film, the transistor is turned on, a different voltage from a bit line voltage (Vb) is applied to a drain region of the transistor and a plate voltage (Vb/2) is applied to the conductive plate, to enhance the resistance of the resistant material.

15. A method for reading a written bit data in a memory device that includes a semiconductor substrate; an NPN-type transistor formed on the semiconductor substrate; an interlayer insulating film formed on the semiconductor substrate to cover the transistor, in which a contact hole exposing a source region of the transistor is formed; a conductive plug filling the contact hole; a resistant material in which a bit data "0" or "1" is written formed on the conductive plug; and a conductive plate formed on the interlayer insulating film to be contacted with the resistant material, wherein the bit data which is written in the resistant material is read by measuring a current flowing through the resistant material and reading the written bit data in the resistant material.

16. The method as claimed in claim 15, wherein after a sense amplifier is connected to a drain region of the transistor, the transistor is turned on and a reading voltage (Vr) is applied to the conductive plate to measure the current flowing through the resistant material.

\* \* \* \* \*